US012578638B2

(12) United States Patent
Lee et al.

(10) Patent No.: US 12,578,638 B2
(45) Date of Patent: Mar. 17, 2026

(54) PHOTOPOLYMER COMPOSITION FOR HOLOGRAM FORMATION, HOLOGRAM RECORDING MEDIUM AND OPTICAL ELEMENTS

(71) Applicant: LG CHEM, LTD., Seoul (KR)

(72) Inventors: Inkyu Lee, Daejeon (KR); Soonhwa Jung, Daejeon (KR); Chulsuk Hong, Daejeon (KR); Yeongrae Chang, Daejeon (KR); Yeonhui Yi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 747 days.

(21) Appl. No.: 17/920,684

(22) PCT Filed: Feb. 4, 2022

(86) PCT No.: PCT/KR2022/001773
§ 371 (c)(1),
(2) Date: Oct. 21, 2022

(87) PCT Pub. No.: WO2022/169307
PCT Pub. Date: Aug. 11, 2022

(65) Prior Publication Data
US 2023/0142827 A1 May 11, 2023

(30) Foreign Application Priority Data
Feb. 5, 2021 (KR) ........................ 10-2021-0016615

(51) Int. Cl.
*G03F 7/00* (2006.01)
*C08L 83/12* (2006.01)
(Continued)

(52) U.S. Cl.
CPC .............. *G03F 7/001* (2013.01); *C08L 83/12* (2013.01); *G02B 1/04* (2013.01); *G02B 5/32* (2013.01);
(Continued)

(58) Field of Classification Search
CPC .......... G03F 7/001; G03F 7/033; G03F 7/038; G03F 7/0757; G03F 7/0388; G03F 7/075;
(Continued)

(56) References Cited

U.S. PATENT DOCUMENTS 7,122,290 B2 10/2006 McLaughlin et al.
11,126,082 B2 9/2021 Jang et al.
(Continued)

FOREIGN PATENT DOCUMENTS

EP 3588499 A1 1/2020
JP 1996-220975 A 8/1997
(Continued)

OTHER PUBLICATIONS

International Search Report dated May 16, 2022, issued in the corresponding International Application No. PCT/KR2022/001773, 4 pages.
(Continued)

*Primary Examiner* — Caleen O Sullivan
(74) *Attorney, Agent, or Firm* — ROTHWELL, FIGG, ERNST & MANBECK, P.C.

(57) ABSTRACT

A photopolymer composition for hologram formation, comprising: a polymer matrix comprising a siloxane-based polymer and a (meth)acrylate polymer containing one or more reactive functional groups in the side chains, a holographic recording method, and an optical element are provided.

14 Claims, 1 Drawing Sheet

(51) Int. Cl.

| | |
|---|---|
| ***G02B 1/04*** | (2006.01) |
| ***G02B 5/32*** | (2006.01) |
| ***G03F 7/033*** | (2006.01) |
| ***G03F 7/038*** | (2006.01) |
| ***G03F 7/075*** | (2006.01) |

(52) U.S. Cl.
CPC .............. *G03F 7/033* (2013.01); *G03F 7/038* (2013.01); *G03F 7/0757* (2013.01)

(58) Field of Classification Search
CPC .......... C08L 83/12; C08L 83/04; C08L 51/08; C08L 33/10; G02B 1/04; G02B 5/32; C08G 77/12; C08G 77/38; C08G 77/445; C08K 5/0025; C08K 5/56; C09D 183/10; C08F 299/08
USPC ............................ 430/1, 270.1, 271.1, 272.1
See application file for complete search history.

(56) References Cited

U.S. PATENT DOCUMENTS

| | | | |
|---|---|---|---|
| 2020/0081398 A1 | 3/2020 | Yaroshchuk |
| 2020/0150528 A1 | 5/2020 | Jang et al. |
| 2020/0192218 A1 | 6/2020 | Jang et al. |
| 2021/0340302 A1 | 11/2021 | Jang et al. |

FOREIGN PATENT DOCUMENTS

| | | | |
|---|---|---|---|
| JP | 2002-149043 | A | 5/2002 |
| JP | 2008-224805 | A | 9/2008 |
| JP | 2010-122462 | A | 6/2010 |
| JP | 2011-198434 | A | 10/2011 |
| JP | 2011-221192 | A | 11/2011 |
| KR | 10-2007-0022321 | A | 2/2007 |
| KR | 10-2019-0066894 | A | 6/2019 |
| KR | 10-2019-0069316 | A | 6/2019 |
| KR | 10-2166848 | B1 | 10/2020 |
| KR | 10-2021-0003510 | A | 1/2021 |

OTHER PUBLICATIONS

Extended European Search Report dated Aug. 11, 2023, of the corresponding European Patent Application No. 22750056.8, 9 pages.

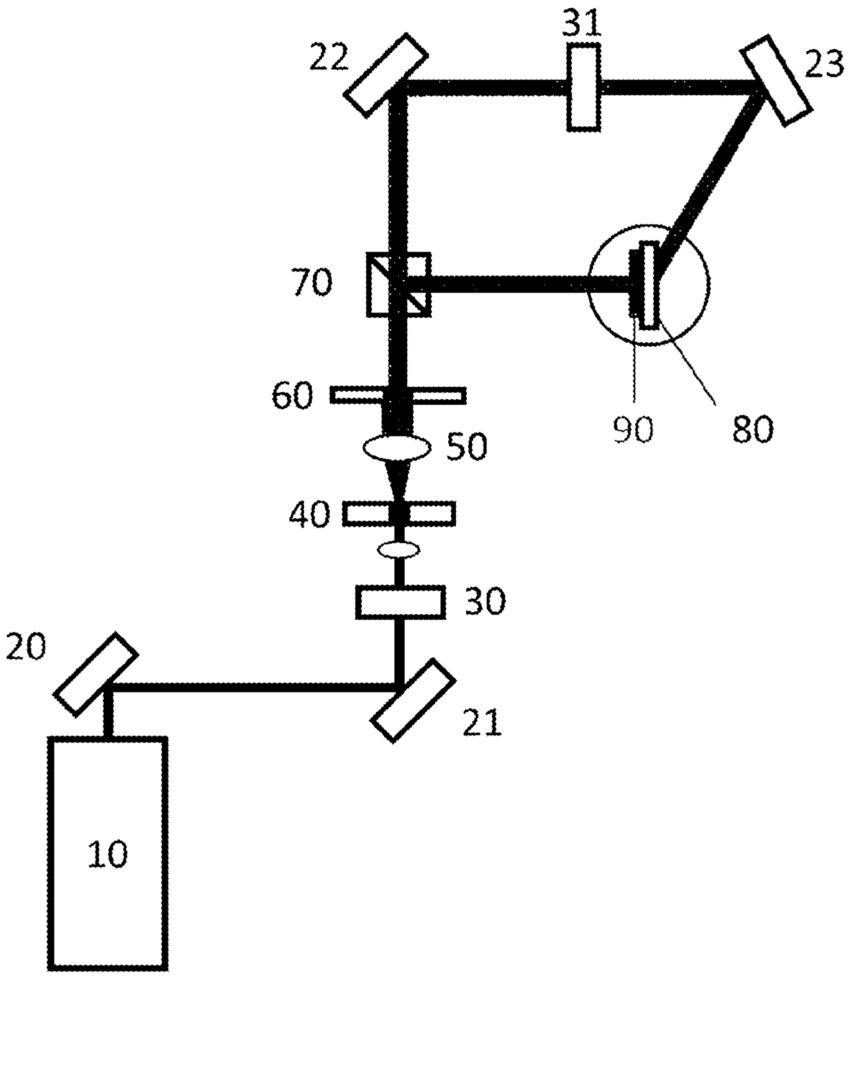
22
31
23
70
90
80
60
50
40
30
20
21
10

PHOTOPOLYMER COMPOSITION FOR HOLOGRAM FORMATION, HOLOGRAM RECORDING MEDIUM AND OPTICAL ELEMENTS

CROSS-REFERENCE TO RELATED APPLICATION(S)

This application is a 35 U.S.C. 371 National Phase Entry Application from PCT/KR2022/001773 filed on Feb. 4, 2022, which claims the benefit of Korean Patent Application No. 10-2021-0016615 filed on Feb. 5, 2021, the disclosures of which are herein incorporated by reference in their entirety.

TECHNICAL FIELD

The present invention relates to a photopolymer composition for hologram formation, a hologram recording medium, and an optical element.

BACKGROUND OF THE INVENTION

Holographic recording medium records information by changing a refractive index in the holographic recording layer in the medium through an exposure process, reads the change of refractive index in the medium thus recorded, and reproduces the information.

In this regard, a photopolymer (photosensitive resin) can be used for hologram production. Since the photopolymer can easily store the light interference pattern as a hologram by photopolymerization of the low molecular weight monomer, it can be used in various fields such as optical lenses, mirrors, deflecting mirrors, filters, diffusing screens, diffraction elements, light guides, waveguides, holographic optical elements having projection screen and/or mask functions, medium of optical memory system and light diffusion plate, optical wavelength multiplexers, reflection type, transmission type color filters, and the like.

Specifically, a photopolymer composition for hologram production includes a polymer binder (or polymer matrix), a monomer, and a photoinitiator. The photopolymer film (photosensitive film) produced from such a composition is irradiated with laser interference light to induce photopolymerization of local monomers. During such photopolymerization process, a portion having a high refractive index and a portion having a low refractive index are generated depending on the relative amounts of the monomer and the polymer, the refractive index modulation occurs, and a diffraction grating is generated by such refractive index modulation. The refractive index modulation value ($\Delta n$) is influenced by the thickness and the diffraction efficiency (DE) of the photopolymer layer, and the angular selectivity is wider as the thickness decreases.

Recently, along with the growing demand for the development of materials capable of maintaining a hologram with high diffraction efficiency and stability, various attempts have been conducted to produce a photopolymer layer having a large refractive index modulation even while being thin.

Furthermore, it is necessary to provide a photopolymer film or a hologram recording medium including the same, which is excellent in reliability despite heat and moisture in the usage environment. Specifically, when the hologram recording medium is used as an optical element in a mobile device or vehicle product (e.g., a head-up display), it is placed under harsh conditions such as high temperature/high humidity. In such a case, the image is distorted while deformation of the diffraction grating occurs, or the intended original function cannot be achieved. Therefore, there is a need to develop a photopolymer film having excellent reliability and including less diffraction grating deformation even when exposed to harsh conditions, and a hologram recording medium including the same.

BRIEF SUMMARY OF INVENTION

It is an object of the present invention to provide a photopolymer composition for hologram formation, a hologram recording medium, and an optical element, which are excellent in reliability and can realize high recording characteristics even when used under harsh conditions such as high temperature/high humidity.

These and other objects and features of the invention can be all achieved by the embodiments of the present invention, which are described in detail below.

Provided herein is a photopolymer composition for hologram formation, comprising: a polymer matrix comprising a siloxane-based polymer and a (meth)acrylate polymer containing one or more reactive functional groups in the side chains; a photoreactive monomer; and a photoinitiator.

Also provided herein is a cover window of a flexible display device comprising the optical laminate.

Further provided herein is an optical element comprising the hologram recording medium.

DETAILED DESCRIPTION OF INVENTION

Now, a photopolymer composition for hologram formation, a hologram recording medium, and an optical element according to specific embodiments of the present invention will be described in more detail.

The term "hologram" as used herein refers to a recording medium in which optical information is recorded in an entire visible range and an ultraviolet range (e.g., 300 to 1,200 nm) through an exposure process, unless otherwise specified. For example, the hologram herein includes all of visual holograms such as in-line (Gabor) holograms, off-axis holograms, full-aperture transfer holograms, white light transmission holograms ("rainbow holograms"), Denisyuk holograms, off-axis reflection holograms, edge-lit holograms or holographic stereograms.

However, this is presented as an example of the invention, and the scope of the invention is not limited thereby, and it will be apparent to those skilled in the art that various modifications can be made without departing from the scope of the present invention.

In relation to the environmental conditions in which the hologram recording medium or the element including the same is placed, the "high temperature" as used herein may mean a temperature of 60° C. or more. For example, the high temperature may mean a temperature of 65° C. or more, 70° C. or more, 75° C. or more, 80° C. or more, 85° C. or more, or 90° C. or more, and the upper limit thereof is not particularly limited, but may be, for example, 110° C. or less, 105° C. or less, 100° C. or less, 95° C. or less, 90° C. or less, 85° C. or less, or 80° C. or less. When temperature affects the characteristics of a substance, an object or each constituent, the temperature condition for measuring or explaining the characteristics may mean room temperature (e.g., a temperature in the range of about 15 to 30° C. which is a temperature at which temperature decrease or heating is not performed), unless otherwise mentioned.

Further, in relation to the environmental conditions in which the hologram recording medium or the element including the same is placed, the "high humidity" as used herein may mean a relative humidity of 80% or more. For example, the high humidity condition may mean a condition satisfying a relative humidity of 85% or more, 90% or more, or 95% or more. When humidity affects the characteristics of a material, an object, or each component, the humidity condition for measuring or explaining the characteristic is a case where the relative humidity is lower than the high humidity condition, unless otherwise mentioned. For example, it may be a relative humidity condition in the range of 15 or more and less than 80%. Specifically, it may mean a relative humidity condition in which the lower limit thereof is 20% or more, 25% or more, 30% or more, 35% or more, 40% or more, and the upper limit thereof is 75% or less, 70% or less, 65% or less, or 60% or less.

Further, the high temperature/high humidity condition as used herein may mean an environmental condition that satisfies any one or more of the high-temperature condition and the high-humidity condition described above.

The technical terms used herein are only for mentioning specific embodiments and they are not intended to restrict the present invention unless there is a particular mention about them.

Singular expressions used herein may include the plural expressions unless they are differently expressed contextually.

The meaning of the term "include" or "comprises" used herein embodies specific characteristics, areas, integers, steps, actions, elements, and/or components, and does not exclude existence or addition of other specific characteristics, areas, integers, steps, actions, elements, components, and/or group.

Further, the weight average molecular weight as used herein means a weight average molecular weight (unit: g/mol) in terms of polystyrene measured by GPC method. In the process of determining the weight average molecular weight in terms of polystyrene measured by the GPC method, a commonly known analyzing device, a detector such as a refractive index detector, and an analytical column can be used. Commonly applied conditions for temperature, solvent, and flow rate can be used. Specific examples of the measurement conditions man include a temperature of 30° C., chloroform solvent and a flow rate of 1 m/min.

As used herein, the alkyl group may be a monovalent functional group derived from alkane, and may be linear or branched. The number of carbon atoms of the linear alkyl group is not particularly limited, but is preferably 1 to 20. Further, the number of carbon atoms of the linear alkyl group is 3 to 20. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, 2,6-dimethyllheptan-4-yl the like, but are not limited thereto. The alkyl group can be substituted or unsubstituted.

As used herein, the alkylene group is a bivalent functional group derived from alkane, and the aforementioned description of the aryl group can be applied except that these are divalent functional groups. For example, the linear or branched alkylene group may include methylene group, ethylene group, propylene group, isobutylene group, sec-butylene group, tert-butylene group, pentylene group, hexylene group, and the like. The alkylene group can be substituted or unsubstituted.

As used herein, the oxyalkylene group is an alkylene group containing one or more —O—, and the aforementioned description of the alkylene group can be applied. The oxyalkylene group can be substituted or unsubstituted.

As used herein, the alkenylene group means a divalent functional group derived from an alkene, and the alkynylene group as used herein may mean a divalent functional group derived from alkyne.

As used herein, the oxyalkenylene group or oxyalkynylene group is an alkenylene group or alkynylene group containing one or more —O—, and the aforementioned description of the alkenylene group or alkynylene group can be applied. The oxyalkenylene group or oxyalkynylene group can be substituted or unsubstituted.

According to one embodiment of the invention, there can be provided a photopolymer composition for hologram formation, comprising: a polymer matrix comprising a siloxane-based polymer and a (meth)acrylate polymer containing one or more reactive functional groups in the side chains; a photoreactive monomer; and a photoinitiator.

The present inventors conducted intensive research on a photopolymer composition for hologram formation that is excellent in reliability and can realize high recording characteristics even when used in harsh conditions such as high temperature/high humidity, and found that in the case of a composition comprising a polymer matrix which includes the siloxane-based polymer and the (meth)acrylate polymer containing one or more reactive functional groups in the side chains, the degree of crosslinking is high and heat resistance and moist heat resistance characteristics are improved, and thus, excellent reliability can be realized even when used in harsh conditions such as high temperature/high humidity, thereby completing the present invention.

That is, the photopolymer composition for hologram formation according to one embodiment may include, as a polymer matrix, a hydrosilylation reactant between a siloxane-based polymer and a (meth)acrylate polymer containing one or more reactive functional groups in the side chains.

The hydrosilylation reactant between a siloxane-based polymer and a (meth)acrylate polymer containing one or more reactive functional groups in the side chains can increase the mobility of the components (e.g., monomer or plasticizer) contained in the photopolymer film by the flexible main chain of the siloxane-based polymer. In addition, the siloxane bond having excellent heat resistance and moist heat resistance characteristics can facilitates ensuring the reliability of a photopolymer film on which optical information is recorded and a recording medium including the same.

The polymer matrix formed by cross-linking the siloxane-based polymer and the (meth)acrylate polymer containing one or more reactive functional groups in the side chains can serve as a support for the final product.

Specifically, in the one embodiment, the polymer matrix may include a cross-linked copolymer between the siloxane-based polymer and the (meth)acrylate polymer containing one or more reactive functional groups in the side chains.

The "copolymer" may include a random copolymer, a block copolymer, and a graft copolymer unless otherwise specified.

That is, the photopolymer composition for hologram formation according to one embodiment may include a cross-linked copolymer that is a hydrosilylation reactant between the siloxane-based polymer and the (meth)acrylate polymer containing one or more reactive functional groups in the side chains.

In one embodiment, the siloxane-based polymer and the (meth)acrylate polymer containing one or more reactive functional groups in the side chains can be cross-linked in the presence of a platinum catalyst.

That is, the hydrosilylation between the above-mentioned siloxane-based polymer and the (meth)acrylate polymer containing one or more reactive functional groups in the side chains can be performed in the presence of a catalyst such as a platinum catalyst, specifically, Karstedt's catalyst or the like.

When the matrix is produced in the presence of a platinum catalyst, the siloxane-based polymer and the (meth) acrylate polymer containing one or more reactive functional groups in the side chains can undergo a rapid cross-linking reaction even at room temperature (e.g., the temperature in the range of about 15 to 30° C. which is a temperature at which temperature decrease or heating is not performed), whereby the polymer matrix formed by cross-linking of the components is suitable from the viewpoint of improving production efficiency and productivity.

Specifically, the (meth)acrylate polymer containing one or more reactive functional groups in the side chains may include a repeating unit derived from a compound represented by the following Chemical Formula 1.

[Chemical Formula 1]

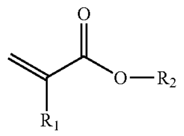

wherein, in Chemical Formula 1, $R_1$ and $R_2$ are each independently hydrogen, an alkyl group having 1 to 10 carbon atoms, or a reactive functional group, and at least one of $R_1$ and $R_2$ is a reactive functional group.

The photopolymer composition for hologram formation according to one embodiment may include a (meth)acrylate polymer containing one or more reactive functional groups in the side chains, which includes a repeating unit derived from the compound represented by Chemical Formula 1.

As the (meth)acrylate polymer containing one or more reactive functional groups in the side chains including a repeating unit derived from the compound represented by Chemical Formula 1 is included, a hydrosilylation reaction occurs between the reactive functional group included in the compound represented by Chemical Formula 1 and the siloxane-based polymer, so that a high degree of crosslinking of the polymer matrix can be realized.

Meanwhile, the reactive functional group is not particularly limited as long as it is a functional group capable of hydrosilylation reaction with the siloxane-based polymer, and for example, it may have a structure including at least one functional group selected from the group consisting of a vinyl group, a hydroxy group, and an epoxy group.

Specifically, the reactive functional group may include one or more vinyl groups. For example, the reactive functional group may include a functional group represented by the following Chemical Formula 2.

[Chemical Formula 2]

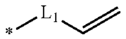

wherein, in Chemical Formula 2, $L_1$ is one of an oxyalkylene group having 1 to 10 carbon atoms, an oxyalkenylene group having 2 to 20 carbon atoms, and an oxyalkynylene group having 2 to 20 carbon atoms.

That is, the reactive functional group containing one or more vinyl groups may include —O— in addition to the vinyl group.

As the reactive functional group includes the functional group represented by Chemical Formula 2, the hydrosilylation reactivity with the siloxane-based polymer becomes very high, which makes it possible to form an excellent degree of crosslinking. Thereby, the photopolymer composition of one embodiment can realize excellent reliability even when used under harsh conditions such as high temperature/high humidity, while realizing high recording efficiency.

More specifically, the reactive functional group may include a functional group represented by the following Chemical Formula 2-1.

[Chemical Formula 2-1]

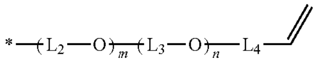

wherein, in Chemical Formula 2-1, $L_2$ to $L_3$ are each independently one of an alkylene group having 1 to 10 carbon atoms, an alkenylene group having 2 to 10 carbon atoms, or an alkynylene group having 2 to 10 carbon atoms, $L_4$ is one of a direct bond, an alkylene group having 1 to 10 carbon atoms, an alkenylene group having 2 to 10 carbon atoms, or an alkynylene group having 2 to 10 carbon atoms, m is an integer from 1 to 10, and n is an integer from 0 to 10.

As the reactive functional group includes a functional group represented by Chemical Formula 2, the hydrosilylation reactivity with the siloxane-based polymer becomes very high, which makes it possible to form an excellent degree of crosslinking. Thereby, the photopolymer composition of one embodiment can realize excellent reliability even when used under harsh conditions such as high temperature/high humidity, while realizing high recording efficiency.

For example, the reactive functional group may include a functional group represented by the following Chemical Formula 2-2 or a functional group represented by the following Chemical Formula 2-3.

[Chemical Formula 2-2]

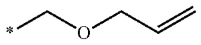

[Chemical Formula 2-3]

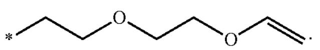

Meanwhile, in the photopolymer composition for hologram formation according to one embodiment, the (meth) acrylate polymer containing one or more reactive functional groups in the side chains may include a repeating unit represented by the following Chemical Formula 3 or a repeating unit represented by the following Chemical Formula 4.

[Chemical Formula 3]

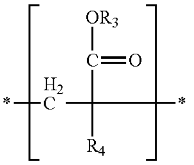

wherein, in Chemical Formula 3, $R_3$ is hydrogen or an alkyl group having 1 to 10 carbon atoms, and $R_4$ is a reactive functional group,

[Chemical Formula 4]

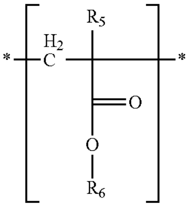

wherein, in Chemical Formula 4, $R_5$ is hydrogen or an alkyl group having 1 to 10 carbon atoms, and $R_6$ is a reactive functional group.

In the photopolymer composition for hologram formation according to one embodiment, as the (meth)acrylate polymer containing one or more reactive functional groups in the side chains includes the repeating unit represented by Chemical Formula 3 or the repeating unit represented by Chemical Formula 4, the hydrosilylation reactivity with the siloxane-based polymer becomes very high, which makes it possible to form an excellent degree of crosslinking. Thereby, the photopolymer composition of one embodiment can realize excellent reliability even when used under harsh conditions such as high temperature/high humidity, while realizing high recording efficiency.

In Chemical Formulas 3 and 4, the reactive functional group may include all of the above-mentioned contents.

That is, the (meth)acrylate polymer containing one or more reactive functional groups in the side chains may include a repeating unit represented by the following Chemical Formula 3-1 or a repeating unit represented by the following Chemical Formula 4-1.

[Chemical Formula 3-1]

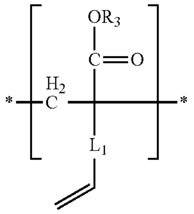

wherein, in Chemical Formula 3-1, $R_3$ is hydrogen or an alkyl group having 1 to 10 carbon atoms, and $L_1$ is one of an oxyalkylene group having 1 to 10 carbon atoms, an oxyalkenylene group having 2 to 20 carbon atoms, and an oxyalkynylene group having 2 to 20 carbon atoms,

[Chemical Formula 4-1]

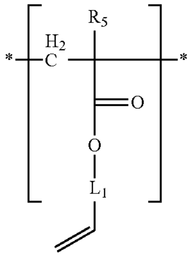

wherein, in Chemical Formula 4-1, $R_5$ is hydrogen or an alkyl group having 1 to 10 carbon atoms, and $L_1$ is one of an oxyalkylene group having 1 to 10 carbon atoms, an oxyalkenylene group having 2 to 20 carbon atoms, and an oxyalkynylene group having 2 to 20 carbon atoms.

More specifically, the (meth)acrylate polymer containing one or more reactive functional groups in the side chains may include a repeating unit represented by the following Chemical Formula 3-2 or a repeating unit represented by the following Chemical Formula 4-2.

[Chemical Formula 3-2]

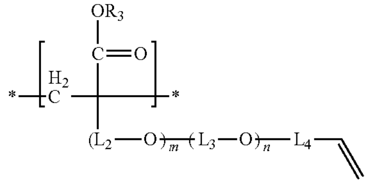

wherein, in Chemical Formula 3-2, $R_3$ is hydrogen or an alkyl group having 1 to 10 carbon atoms, $L_2$ to $L_3$ are each independently one of an alkylene group having 1 to 10 carbon atoms, an alkenylene group having 2 to 10 carbon atoms, or an alkynylene group having 2 to 10 carbon atoms, $L_4$ is one of a direct bond, an alkylene group having 1 to 10 carbon atoms, an alkenylene group having 2 to 10 carbon atoms, or an alkynylene group having 2 to 10 carbon atoms, m is an integer from 1 to 10, and n is an integer from 0 to 10,

[Chemical Formula 4-2]

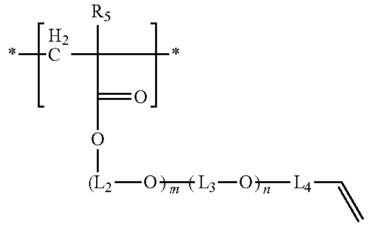

wherein, in Chemical Formula 4-2, $R_6$ is hydrogen or an alkyl group having 1 to 10 carbon atoms, $L_2$ to $L_3$ are each independently one of an alkylene group having 1 to 10 carbon atoms, an alkenylene group having 2 to 10 carbon atoms, or an alkynylene group having 2 to 10 carbon atoms, $L_4$ is one of a direct bond, an alkylene group having 1 to 10 carbon atoms, an alkenylene group having 2 to 10 carbon atoms, or an alkynylene group having 2 to 10 carbon atoms, m is an integer from 1 to 10, and n is an integer from 0 to 10.

For example, the (meth)acrylate polymer containing one or more reactive functional groups in the side chains may include a repeating unit represented by the following Chemical Formula 3-3 or a repeating unit represented by the following Chemical Formula 4-3.

[Chemical Formula 3-3]

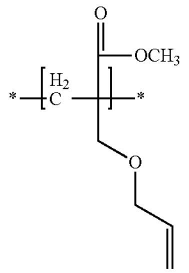

[Chemical Formula 4-3]

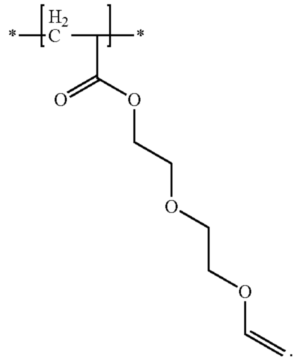

Meanwhile, in one embodiment, the siloxane-based polymer may include a siloxane-based polymer containing one or more silane functional groups.

The number average molecular weight (measured by GPC) (Mn) of the siloxane-based polymer may be a molecular weight of 200 g/mol or more and 800 g/mol or less. Specifically, the lower limit of the number average molecular weight of the siloxane-based polymer may be, for example, 250 g/mol or more, 300 g/mol or more, 350 g/mol or more, 400 g/mol or more, 450 g/mol or more, 500 g/mol or more, 550 g/mol or more, 600 g/mol or more, 650 g/mol or more, 700 g/mol or more, 750 g/mol or more, 800 g/mol or more, 850 g/mol or more, 900 g/mol g/mol or more, 950 g/mol or more or 1,000 g/mol or more, and the upper limit thereof may be, for example, 3,500 g/mol or less, 3,000 g/mol or less, 2,500 g/mol or less, 2,000 g/mol or less, 1,500 g/mol or less. When the above range is satisfied, the hologram recording medium using the photopolymer composition for hologram formation according to one embodiment can have excellent optical recording characteristics and excellent durability under high temperature/high humidity conditions. Specifically, crosslinking (or curing) between the siloxane-based polymer and the (meth)acrylate polymer can be performed at room temperature or higher. When the number average molecular weight of the siloxane-based polymer containing the silane functional group (Si—H) is less than the above range, the siloxane-based polymer volatilizes in the process of crosslinking with the (meth)acrylate polymer, and the degree of matrix crosslinking may decrease, thereby deteriorating the recording characteristics for optical information. Further, when the number average molecular weight of the siloxane-based polymer containing the silane functional group (Si—H) exceeds the above range, the compatibility with the photopolymer film forming components is poor, and phase separation from the photopolymer film forming components may occur, resulting in deterioration of recording properties for optical information.

Further, in the one embodiment, the (meth)acrylate polymer containing one or more reactive functional groups in the side chains may have a weight average molecular weight of 200,000 g/mol or more and 900,000 g/mol or less. The weight average molecular weight means a weight average molecular weight in terms of polystyrene measured by GPC method as described above. For example, the lower limit of the weight average molecular weight may be 200,000 g/mol or more, 250,000 g/mol or more, or 300,000 or more, and the upper limit thereof may be, for example, 900,000 g/mol or less, 850,000 g/mol or less, 800,000 g/mol or less, 750,000 g/mol or less, 700,000 g/mol or less, 650,000 g/mol or less, 600,000 g/mol or less, 550,000 or less. g/mol or less, or 500,000 g/mol or less. When the weight average molecular weight of the (meth)acrylate polymer containing one or more reactive functional groups in the side chains is less than the above range, the matrix does not sufficiently function as a support, a decrease in the recording characteristics for optical information may be excessive with the lapse of usage time. Further, when the weight average molecular weight of the (meth)acrylate polymer containing one or more reactive functional groups in the side chains exceeds the above range, the flexibility of the matrix decreases and the mobility of components (e.g., monomers or plasticizers, etc.) contained in the photopolymer film may decrease, which may result in a decrease in the recording characteristics for optical information.

Meanwhile, in the one embodiment, the reactive functional group equivalent of the (meth)acrylate polymer containing one or more reactive functional groups in the side chains can be adjusted to the level at which the crosslinking density between the siloxane polymer and the (meth)acrylate polymer containing one or more reactive functional groups in the side chains is advantageous for ensuring the function of the hologram recording medium. Specifically, the reactive functional group equivalent of the (meth)acrylate polymer including the one or more reactive functional groups in the side chain may be, for example, 500 g/equivalent or more and 3000 g/equivalent or less. For example, the lower limit of the reactive functional group equivalent of the (meth) acrylate polymer containing one or more reactive functional groups in the side chains may be 600 g/equivalent or more, 700 g/equivalent or more, 800 g/equivalent or more, 900 g/equivalent or more, 1000 g/equivalent or more, 1100 g/equivalent or more, 1200 g/equivalent or more, 1300 g/equivalent or more, 1400 g/equivalent or more, 1500 g/equivalent or more, 1600 g/equivalent or more, 1700 g/equivalent or more, or 1730 g/equivalent or more. And, the upper limit of the reactive functional group equivalent of the (meth) acrylate polymer including one or more reactive functional groups in the side chain may be, for example, 2900 g/equivalent or less, 2800 g/equivalent or less, 2700 g/equivalent or less, 2600 g/equivalent or less, 2500 g/equivalent or less, 2400 g/equivalent or less, 2300 g/equivalent or less, 2200 g/equivalent or less, 2100 g/equivalent or less, 2000 g/equivalent or less, 1900 g/equivalent or less, or 1880 g/equivalent or less. The reactive functional group equivalent of the (meth)acrylate polymer containing one or more reactive functional groups in the side chains is the equivalent (g/equivalent) of one reactive functional group, and is a value obtained by dividing the weight average molecular weight of the (meth) acrylate polymer containing one or more reactive functional groups in the side chains by the number of reactive functional groups per molecule. The smaller the equivalent value, the higher the density of functional groups, and the larger the equivalent value, the smaller the functional group density. When the vinyl group equivalent of the (meth) acrylate polymer containing one or more reactive functional groups in the side chains is less than the above range, the crosslinking density of the matrix becomes too high and thus inhibits the mobility of the components contained in the photopolymer film, which may result in a decrease in the recording characteristics for optical information. Further, when the vinyl group equivalent of the (meth)acrylate polymer containing one or more reactive functional groups in the side chains is too high, the crosslinking density is too low, so that the matrix cannot serve as a support, whereby the interface of the diffraction gratings generated after recording is collapsed, and the refractive index modulation value may decrease with the lapse of time.

In one embodiment, the refractive index of the (meth) acrylate polymer containing one or more reactive functional groups in the side chains may be 1.40 to less than 1.50. Specifically, the lower limit of the refractive index of the (meth)acrylate polymer containing one or more reactive functional groups in the side chains may be, for example, 1.41 or more, 1.42 or more, 1.43 or more, 1.44 or more, 1.45 or more, or 1.46 or more, and the upper limit thereof may be, for example, 1.49 or less, 1.48 or less, 1.47 or less, 1.46 or less, or 1.45 or less. When the refractive index satisfies the above range, it can contribute to increase the refractive index modulation. The refractive index of the polyol is a theoretical refractive index, and can be calculated using the value measured using the Abbe refractometer and the fraction (molar ratio) of each monomer for the refractive index of the monomer used for producing the (meth)acrylate polymer.

Meanwhile, in the one embodiment, the ratio of the functional group (reactive functional group) of the silane functional group (Si—H) of the siloxane-based polymer to the (meth)acrylate polymer containing one or more reactive functional groups in the side chains (Si—H)/reactive functional group) may satisfy the range of 0.80 to 1.20.

Specifically, the reactive functional group may be a vinyl group.

When the hydrosilyation reaction ($SiH+CH_2{=}C{-}\rightarrow Si{-}CH_2{-}C{-}$) occurs between the functional group (Si—H) of the siloxane-based polymer and the functional groups (vinyl groups) of the (meth)acrylate polymer containing one or more reactive functional groups in the side chains, the molar ratio (Si—H/vinyl group) between the reaction functional groups in the reaction may be in the range of 0.80 to 1.20. That is, the type and/or content of the siloxane-based polymer and the (meth)acrylate polymer containing one or more reactive functional groups in the side chains can be selected so as to satisfy the above ratio at the time of forming the polymer matrix. When the above ratio is satisfied, it is advantageous to ensure the diffraction efficiency on the surface of the photopolymer film as described above. The lower limit of the ratio may be, for example, 0.81 or more, specifically 0.85 or more, 0.90 or more, 0.95 or more, 1.00 or more, or 1.05 or more, and the upper limit thereof may be, for example, 1.19 or less, specifically 1.15 or less, 1.10 or less, 1.05 or less, 1.00 or less, or 0.95 or less. When the ratio is smaller than the lower limit of the range, the cross-linking structure may be fragile and the recording efficiency may be good, but the reliability under high temperature and high humidity conditions during actual use after recording is not good. Further, when the ratio is larger than the upper limit of the range, the cross-linked structure is dense and thus, the reliability under high temperature/high humidity conditions may be excellent, but the moving speed of the recording material (e.g., a photoreactive monomer or a plasticizer, etc.) decreases, so that the refractive index modulation is not sufficient and the recording efficiency is reduced.

The photopolymer composition for hologram formation according to one embodiment includes a photoreactive monomer. In the present application, the photopolymer composition for hologram formation comprising a photoreactive monomer means that as light (laser) irradiation is performed, the photoreactive monomer reacting with light is polymerized, whereby the photopolymer film including the photopolymer composition for hologram formation includes a photoreactive monomer and/or a photoreactant of the photoreactive monomer (or polymer). In an illustrative embodiment, the photoreactive monomer may be cross-linked to the polymer matrix.

Specifically, the photoreactive monomer may be a monofunctional or polyfunctional (meth)acrylate monomer, or may include at least one of them. Wherein, the "(meth) acrylate" may mean methacrylate or acrylate unless otherwise specified.

As described above, when a photopolymer film is formed using the photopolymer composition for hologram formation, it is possible to selectively polymerize a photoreactive monomer for each region while irradiating the composition with a laser. For example, in the destructive interference region, photopolymerization is inhibited or does not occur, so that a relatively large amount of photoreactive monomers is present, and in the constructive interference region, photopolymerization occurs and photoreactive monomers (high refractive index) are polymerized. As a result of polymerization, the refractive index is relatively high in a portion where a relatively large amount of polymer is present, resulting in a refractive index modulation. Then, the photoreactive monomer is continuously consumed in the constructive interference region, whereby a concentration difference occurs between the photoreactive monomer in the destructive interference region and the photoreactive monomer in the constructive interference region. As a result, the photoreactive monomer in the destructive interference region diffuses into the constructive interference region. A diffraction grating is generated by the refractive index modulation generated in this way.

Specifically, examples of the photoreactive monomer may include (meth)acrylate-based α,β-unsaturated carboxylic acid derivative, for example, (meth)acrylate, (meth)acrylamide, (meth)acrylonitrile or (meth)acrylic acid, or a compound containing a vinyl group or a thiol group.

Meanwhile, the photoreactive monomer may have a higher refractive index than a matrix or a component forming the matrix (e.g., the (meth)acrylate polymer and/or the siloxane-based polymer).

In one embodiment, the refractive index of the photoreactive monomer may be 1.50 or more. In another embodiment, the photoreactive monomer may be, or may include, a monofunctional or polyfunctional (meth)acrylate monomer having a refractive index of 1.50 or more. The refractive index can be measured with an Abbe refractometer. Specifically, the lower limit of the refractive index of the photoreactive monomer or a monofunctional or polyfunctional (meth)acrylate monomer, which is an example thereof, may be, for example, 1.51 or more, 1.52 or more, 1.53 or more, 1.54 or more, 1.55 or more, 1.56 or more, 1.57 or more. or more, 1.58 or more, 1.59 or more, or 1.60 or more, and the upper limit thereof may be, for example, 1.70 or less, 1.69 or less, 1.68 or less, 1.67 or less, 1.66 or less, or 1.65 or less. Although it is not especially limited, the polyfunctional (meth)acrylate monomer satisfying the refractive index may include a halogen atom (bromine, iodine, etc.), sulfur (S), phosphorus (P), or an aromatic ring. More specific examples of the polyfunctional (meth)acrylate monomer having the refractive index of 1.50 or more include bisphenol A modified diacrylate type, fluorene acrylate type (HR6022, Miwon Specialty Chemical Co., Ltd.), bisphenol fluorene epoxy acrylate type (HR6100, HR6060, HR6042, etc.—Specialty Chemical Co., Ltd.), halogenated epoxy acrylate type (HR1139, HR3362, etc.—Specialty Chemical Co., Ltd.).

Although it is not especially limited, the monofunctional (meth)acrylate monomer satisfying the above refractive index may include an ether bond and a fluorene functional group in its molecule. Specific examples of such monofunctional (meth)acrylate monomer include phenoxybenzyl (meth)acrylate, o-phenylphenol ethylene oxide (meth)acrylate, benzyl (meth)acrylate, 2-(phenylthio)ethyl (meth)acrylate, biphenylmethyl (meth)acrylate, or the like.

In one embodiment, the photoreactive monomer may have a weight average molecular weight of 50 g/mol to 1000 g/mol, or 200 g/mol to 600 g/mol. The weight average molecular weight means a weight average molecular weight in terms of polystyrene measured by GPC method as described above.

In one embodiment, the photopolymer composition for hologram formation may include the photoreactive monomer in an amount of 50 to 130 parts by weight based on 100 parts by weight of the polymer matrix component. For example, the lower limit of the content of the photoreactive monomer may be, for example, 50 parts by weight or more, 55 parts by weight or more, 75 parts by weight or more, 90 parts by weight or more, or 100 parts by weight or more, and the upper limit thereof may be, for example, 130 parts by weight or less, 120 parts by weight or less, 110 parts by weight or less, or 105 parts by weight or less. In this case, the content of the polymer matrix component as a reference means the total content (weight) of the (meth)acrylate polymer and the siloxane polymer forming the matrix. When the above range is satisfied, it is advantageous to ensure the optical recording characteristics and high temperature/high humidity durability.

In one embodiment, the photoinitiator is a compound which is activated by light or actinic radiation and initiates polymerization of a compound containing a photoreactive functional group such as the photoreactive monomer. The type of the photoinitiator is not particularly limited. For example, a known or commercially available photoinitiator known as a radical photopolymerization initiator, a photocationic polymerization initiator, or a photoanionic polymerization initiator can be used without limitation.

In an illustrative embodiment, the photoradical polymerization initiator may include imidazole derivatives, bisimidazole derivatives, N-aryl glycine derivatives, organic azide compounds, titanocene, aluminate complex, organic peroxide, N-alkoxypyridinium salts, thioxanthone derivatives, amine derivative or the like. Specifically, the photoradical polymerization initiator may include 1,3-di(t-butyldioxycarbonyl)benzophenone, 3,3',4,4"-tetrakis(t-butyldioxycarbonyl)benzophenone, 3-phenyl-5-isoxazolone, 2-mercapto benzimidazole, bis(2,4,5-triphenyl)imidazole, 2,2-dimethoxy-1,2-diphenylethane-1-one (product name: Irgacure 651/manufacturer: BASF), 1-hydroxy-cyclohexyl-phenyl-ketone (product name: Irgacure 184/manufacturer: BASF), 2-benzyl-2-dimethylamino-1-(4-morpholinophenyl)-butanone-1 (product name: Irgacure 369/manufacturer: BASF), and bis(η5-2,4-cyclopentadiene-1-yl)-bis(2,6-difluoro-3-(1H-pyrrole-1-yl)-phenyl)titanium (product name: Irgacure 784/manufacturer: BASF), Ebecryl P-115 (manufacturer: SK entis), or the like, but are not limited thereto.

The photocationic polymerization initiator may include a diazonium salt, a sulfonium salt, or an iodonium salt, and examples thereof include sulfonic acid esters, imidosulfonates, dialkyl-4-hydroxysulfonium salts, arylsulfonic acid-p-nitrobenzyl ester, silanol-aluminum complexes, (η6-benzene) (η5-cyclopentadienyl)iron (II), or the like. In addition, benzoin tosylate, 2,5-dinitrobenzyltosylate, N-tosylphthalic acid imide, or the like can be mentioned as the example of the photocationic polymerization initiator. More specific examples of the photocationic polymerization initiator include commercially available products such as Cyracure UVI-6970, Cyracure UVI-6974 and Cyracure UVI-6990 (manufacturer: Dow Chemical Co. in USA), Irgacure 264 and Irgacure 250 (manufacturer: BASF) or CIT-1682 (manufacturer: Nippon Soda), but are not limited thereto.

Further, the photoanionic polymerization initiator may include a borate salt, and examples thereof include butyrylchlorine butyl triphenylborate or the like. More specific examples of the photoanionic polymerization initiator include commercially available products such as Borate V (manufacturer: Spectra Group) or the like.

Meanwhile, the photopolymer composition for hologram formation may include monomolecular (type I) initiator or bimolecular (type II) initiator. The (type I) system for free radical photopolymerization may include, for example, an aromatic ketone compounds in combination with a tertiary amine, such as benzophenone, alkylbenzophenone, 4,4'-bis(dimethylamino)benzophenone (Michler's ketone), anthrone and halogenated benzophenone or a mixture of these types. The bimolecular (type II) initiator may include benzoin and derivatives thereof, benzyl ketal, acylphosphine oxide, for example, 2,4,6-trimethylbenzoyldiphenylphosphine oxide, bisacylophosphine oxide, phenylglyoxyl ester, camphorquinone, alpha-aminoalkylphenone, alpha-dialkoxyacetophenone, 1-[4-(phenylthio)phenyl]octane-1,2-dione 2-(O-benzoyloxime), alpha-hydroxyalkylphenone, and the like.

In an illustrative embodiment, the photopolymer composition for hologram formation may include the initiator in an amount of 0.1 to 10.0 parts by weight based on 100 parts by weight of the polymer matrix component. Specifically, the lower limit of the content of the initiator may be, for example, 0.2 parts by weight or more, 0.3 parts by weight or more, 0.4 parts by weight or more, 0.5 parts by weight or more, 0.6 parts by weight or more, 0.7 parts by weight or more, 0.8 parts by weight or more, or 0.9 parts by weight or more, and the upper limit thereof may be, for example, 5.0 parts by weight or less. When the above range is satisfied, it is advantageous to ensure the optical recording characteristics and high temperature/high humidity durability.

Meanwhile, the photopolymer composition for hologram formation may further include a plasticizer containing one or more compounds selected from the group consisting of a phosphorus compound and a fluorine compound.

Specifically, the fluorine-based compound may be a non-reactive compound.

In an illustrative embodiment, the fluorine-based compound may include at least one functional group selected from the group consisting of an ether group, an ester group, and an amide group, and two or more difluoromethylene groups. More specifically, the fluorine-based compound may have a structure of Chemical Formula 5 in which a functional group containing an ether group is bonded to both ends of a central functional group containing a direct bond or an ether bond between two difluoromethylene groups.

[Chemical Formula 5]

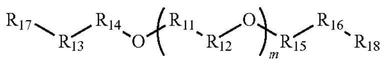

wherein, in Chemical Formula 5, $R_1$ and $R_{12}$ are each independently a difluoromethylene group, $R_{13}$ and $R_{16}$ are each independently a methylene group, $R_{14}$ and $R_{15}$ are each independently a difluoromethylene group, $R_{17}$ and $R_{18}$ are each independently a polyalkylene oxide group, and m is an integer of 1 or more, or 1 to 10, or 1 to 3. In this regard, the "alkylene group" means a divalent functional group derived from an alkane. For example, the alkylene group is linear, branched, or cyclic, and may include a methylene group, an ethylene group, a propylene group, an isobutylene group, a sec-butylene group, a tert-butylene group, a pentylene group, a hexylene group, and the like, but are not limited thereto.

In an illustrative embodiment, more preferably, $R_{11}$ and $R_{12}$ in Chemical Formula 5 are each independently a difluoromethylene group, $R_{13}$ and $R_{16}$ are each independently a methylene group, $R_{14}$ and $R_{15}$ are each independently a difluoromethylene group, $R_{17}$ and $R_{18}$ are each independently a 2-methoxyethoxymethoxy group, and m is an integer of 2.

In an illustrative embodiment, as the fluorine-based compound, one having a lower refractive index than that of the photoreactive monomer can be used. In this case, the refractive index of the polymer matrix can be lowered, thereby increasing the refractive index modulation.

In an illustrative embodiment, the refractive index of the fluorine-based compound may be less than 1.45. Specifically, the refractive index of the fluorine-based compound may be 1.44 or less, 1.43 or less, 1.42 or less, 1.41 or less, 1.40 or less, 1.40 or less, 1.39 or less, 1.38 or less, 1.37 or less, 1.36 or less, or 1.35 or less, and the lower limit of the refractive index may be, for example, 1.30 or more, 1.31 or more, 1.32 or more, 1.33 or more, 1.34 or more, 1.35 or more, 1.36 or more, or 1.37 or more. Since the fluorine-based compound having a lower refractive index than the photoreactive monomer having a refractive index of 1.5 or more is used, the refractive index of the polymer matrix can be lowered, and the refractive index modulation with the photoreactive monomer can be further increased. The refractive index may be measured with an ABBE refractometer.

As described above, in the case of using a fluorine-based compound having stability with almost no reactivity and having low refractive characteristics compared to the photoreactive monomer, the refractive index modulation can be further increased.

In an illustrative embodiment, the photopolymer composition for hologram formation may include the fluorine-based compound in an amount of 20 to 75 parts by weight based on 100 parts by weight of the polymer matrix component. Specifically, the lower limit of the content of the fluorine-based compound may be, for example, 25 parts by weight or more, 30 parts by weight or more, 35 parts by weight or more, 40 parts by weight or more, 45 parts by weight or more, 50 parts by weight or more, or 55 parts by weight or more, and the upper limit thereof may be, for example, 70 parts by weight or less, 65 parts by weight or less, or 60 parts by weight or less. In this case, the content of the polymer matrix component as a reference means the total content (weight) of the (meth)acrylate polymer and the siloxane polymer forming the matrix. When the above range is satisfied, it is advantageous to secure excellent optical recording characteristics. When the content of the fluorine-based compound is less than the above range, the refractive index modulation value after recording may be lowed due to the deficiency of the low refractive component. And, when the content of the fluorine-based compound content exceeds the above range, due to compatibility problems between components contained in the photopolymer film, haze may occur or some fluorine-based compounds may be eluted onto the surface of the coating layer.

In an illustrative embodiment, the fluorine-based compound may have a weight average molecular weight of 300 or more. Specifically, the lower limit of the weight average molecular weight of the fluorine-based compound may be, for example, 350 or more, 400 or more, 450 or more, 500 or more, 550 or more, or 600 or more, and the upper limit thereof may be, for example, 1000 or less, 900 or less, 800 or less, 700 or less, 600 or less, or 500 or less. Considering the refractive index modulation, compatibility with other components, and elution problem of fluorine-based compounds, it is preferable to satisfy the above weight average molecular weight range. Wherein, the weight average molecular weight means a weight average molecular weight in terms of polystyrene measured by GPC method as described above.

Since the fluorine-based compound has a lower refractive index than the photoreactive monomer, the refractive index of the polymer matrix can be lowered, thereby maximizing the refractive index modulation of the photopolymer composition.

Specifically, as the phosphorus-based compound, a phosphate-based compound such as tributyl phosphate can be used. In particular, the phosphate-based compound functioning as a plasticizer not only lowers the glass transition temperature of the polymer matrix, and thus increases the mobility of the photoreactive monomer and the low-refractive component, but also contributes to improving the moldability of the composition or film. Further, the plasticizer is non-reactive, is uniformly distributed in the composition, and when the photoreactive monomer that is not photopolymerized moves, it moves in the opposite direction and thus contributes to refractive index modulation.

Moreover, the phosphate-based compound acts as a plasticizer, lowers the glass transition temperature of the polymer matrix, increases the mobility of the photoreactive monomer and the low-refractive component, and also contributes to improving the moldability of the photopolymer composition.

In an illustrative embodiment, the photopolymer composition for hologram formation may further include a photosensitive dye. Specifically, the composition used to form the photopolymer film may further include a photosensitive dye.

The photosensitizing dye serves as photosensitizing pigment to sensitize the photoinitiator. Specifically, the photosensitizing dye may be stimulated by the light irradiated on the composition and may also serve as an initiator for initiating polymerization of a photoreactive monomer.

The types of the photosensitizing dyes are not particularly limited, and can be appropriately selected and used from compounds known to perform the above function. The photosensitizing dye that can be used includes sulfonium derivative of ceramidonine, new methylene blue, thioerythrosine triethylammonium, 6-acetylamino-2-methylceramidonin, eosin, erythrosine, rose bengal, thionine, basic yellow, Pinacyanol chloride, Rhodamine 6G, Gallocyanine, ethyl violet, Victoria blue R, Celestine blue, Quinaldine Red, Crystal Violet, Brilliant Green, Astrazon orange G, Darrow Red, Pyronin Y, Basic Red 29, pyrylium iodide, Safranin O, Cyanine, Methylene Blue, Azure A, or a combination of two or more thereof.

In an illustrative embodiment, the photopolymer composition for hologram formation may include the photosensitive dye in an amount of 0.05 to 10 parts by weight based on 100 parts by weight of the polymer matrix component. Specifically, the lower limit of the content of the photosensitive dye may be, for example, 0.1 parts by weight or more, 0.2 parts by weight or more, 0.3 parts by weight or more, 0.4 parts by weight or more, or 0.5 parts by weight or more, and the upper limit thereof may be, for example, 10 parts by weight or less, 5 parts by weight or less, or 1 part by weight or less. In this case, the content of the polymer matrix component as a reference means the total content (weight) of the (meth)acrylate polymer and the siloxane polymer forming the matrix. When the above range is satisfied, it is advantageous to increase or decrease the photoinitiator and secure the optical recording characteristics.

Meanwhile, the photopolymer composition for hologram formation may further include a solvent.

The solvent may be an organic solvent.

For example, ketones, alcohols, acetates and ethers, or mixtures of two or more thereof may be used as the organic solvent, but is not limited thereto.

Specific examples of such organic solvent include ketones such as methyl ethyl ketone, methyl isobutyl ketone, acetylacetone or isobutyl ketone; alcohols such as methanol, ethanol, n-propanol, i-propanol, n-butanol, i-butanol or t-butanol; acetates such as ethyl acetate, i-propyl acetate, or polyethylene glycol monomethyl ether acetate; ethers such as tetrahydrofuran or propylene glycol monomethyl ether; or a mixture of two or more thereof.

The organic solvent may be added at the time of mixing the respective components contained in the photopolymer composition for hologram formation, or may be contained in the photopolymer composition for hologram formation while adding the respective components in a state of being dispersed or mixed in an organic solvent.

For example, the photopolymer composition for hologram formation may include a solvent so that the concentration of the total solid content of the components contained in the composition is 1 to 70% by weight. Specifically, the composition may include a solvent so that the concentration of the total solid content of the components contained in the composition is 2% by weight or more, 5% by weight or more, 10% by weight or more, or 20% by weight or more, and 65% by weight or less, 60% by weight or less, 55% by weight or less or 50% by weight or less. When the content of the solvent in the composition is too low, the flowability of the photopolymer composition may be lowered, resulting in the occurrence of defects such as the occurrence of striped patterns on the finally produced film. In addition, when the solvent is added in an excess amount, the solid content is lowered, and the coating and film formation are not sufficient, so that the physical properties and surface characteristics of the photopolymer film may be deteriorated and defects may occur during the drying and curing process.

Further, the photopolymer composition for hologram formation may further include a catalyst. For example, the composition may include a catalyst commonly known to facilitate the polymerization of polymer matrices or photoreactive monomers. Examples of the catalyst include Platinum-based catalysts such as Karstedt, Rhodium-based, Iridium-based, Rhenium-based, Molybdenum-based, Iron-based, Nickel-based catalysts, or alkali metal or alkaline earth metal catalysts. As the non-metal-based catalyst, a Lewis acids-based catalyst or a Carbene-based catalyst may be used.

Further, in an illustrative embodiment, the photopolymer composition for hologram formation may further include other additives. Other additives that can be used include, for example, a defoaming agent.

In an illustrative embodiment, as the defoaming agent, a silicone-based reactive additive may be used, and a commercially available product such as Tego Rad 2500 may be used.

In an illustrative embodiment, as the other additives, those having a lower refractive index than that of the photoreactive monomer can be used. In this case, the refractive index of the polymer matrix can be lowered, thereby increasing the refractive index modulation. Specifically, the refractive index of the additive may be, for example, less than 1.5.

Specifically, the additive may have a refractive index of 1.45 or less, 1.44 or less, 1.43 or less, 1.42 or less, 1.41 or less, 1.40 or less, and the lower limit of the refractive index may be, for example, 1.30 or more, 1.31 or more, 1.32 or more, 1.33 or more, 1.34 or more, or 1.35 or more. As described above, since the photoreactive monomer has a refractive index of 1.5 or more, the additive satisfying the refractive index can lower the refractive index of the polymer matrix through a lower refractive index than the photoreactive monomer, and can further increase the refractive index modulation with the photoreactive monomer.

Although it is not especially limited, in an illustrative embodiment, the additive having a weight average molecular weight of 700 or less may be used. The weight average molecular weight means a weight average molecular weight in terms of polystyrene measured by GPC method as described above.

The content of the additive, for example, a defoaming agent or a plasticizer, may be appropriately adjusted at a level that does not impair the function of the hologram recording medium.

In an illustrative embodiment, the photopolymer composition for hologram formation may include the other additives in an amount of 5 to 50 parts by weight based on 100 parts by weight of the polymer matrix component. Specifically, the lower limit of the content of the other additives may be, for example, 10 parts by weight or more, 15 parts by weight or more, 20 parts by weight or more, 25 parts by weight or more, 30 parts by weight or more, 35 parts by weight or more, 40 parts by weight or more, or 45 parts by weight or more, and the upper limit thereof may be, for example, 45 parts by weight or less, 40 parts by weight or less, 35 parts by weight or less, 30 parts by weight or less, 25 parts by weight or less, 20 parts by weight or less, 15 parts by weight or less, or 10 parts by weight or less. When the above range is satisfied, the effect due to the use of the additive can be appropriately ensured without interfering with the properties required in the photopolymer composition for hologram formation.

In an illustrative embodiment, when the additive is used together with a fluorine-based compound, they can be used in a weight ratio of 1:5 to 5:1. Specifically, the weight ratio (the weight of the fluorine-based compound: the weight of the additive) may be in the range of 1:3 to 3:1, and in some cases, the fluorine-based compound may be used in an excessive amount.

According to the present invention, a hologram recording medium produced from the photopolymer composition for hologram formation can be provided.

The hologram recording medium may be one in which a reflection type hologram or a transmission type hologram is recorded.

The use of the hologram recording medium having the above characteristics is not particularly limited. For example, it may be used for applications that are likely to be exposed under high temperature/high humidity conditions, specifically, smart devices such as mobile devices, wearable display parts, or automobile parts (e.g., head-up displays), and the like.

The hologram recording medium having the above characteristics can be produced by the method described below.

The hologram recording medium produced from the photopolymer composition for hologram formation may include a photopolymer film produced from the photopolymer composition for hologram formation.

The thickness of the photopolymer film may be in the range of 5.0 μm to 40.0 μm. Specifically, the thickness of the photopolymer film may be, for example, 6 μmm or more, 7 μm or more, 8 μm or more, 9 μm or more, 10 μm or more, 11 μm or more, 12 μm or more, 13 μm or more, 14 μm or more or 15 μm or more. And, the upper limit thereof may be, for example, 35 μmor less or 30 μm or less, specifically 29 μm or less, 28 μm or less, 27 μm or less, 26 μm or less, 25 μm or less, 24 μm or less, 23 μm or less, 22 μm or less, 21 μm or less, 20 μm or less, 19 μm or less or 18 μm or less. The hologram recording medium of the present invention is excellent in refractive index modulation, diffraction efficiency, and driving reliability even when it has a thin thickness within the above-mentioned range.

In an illustrative embodiment, the hologram recording medium may further include a substrate on at least one surface of the photopolymer film. The type of the substrate is not particularly limited, and those known in the related technical fields can be used. For example, a substrate such as glass, PET (polyethylene terephthalate), TAC (triacetyl cellulose), PC (polycarbonate), or COP (cyclo-olefin polymer) can be used.

Specifically, the method for producing the hologram recording medium may comprise the steps of irradiating laser light to a composition (or mixture) containing a polymer matrix or a precursor thereof, a photoreactive monomer, and a photoinitiator, polymerizing the photoreactive monomer, and recording optical information.

The details of the components contained in the composition, for example, a polymer matrix, a photoreactive monomer, a plasticizer, and a photoinitiator are the same as described above.

In an illustrative embodiment, the composition may be produced by mixing the polymer matrix, the photoreactive monomer, the plasticizer, the photoinitiator, and the like.

At this time, the siloxane-based polymer and the (meth) acrylate polymer containing one or more reactive functional groups in the side chains that form the polymer matrix are components that cure at a temperature of about room temperature or a higher temperature formed by heat without irradiation with light. And, the photoreactive monomer is a component that reacts (polymerizes) with light rather than heat. Therefore, when a polymer matrix component formed by crosslinking the siloxane-based polymer and the (meth) acrylate polymer containing one or more reactive functional groups in the side chains, a photoreactive monomer, a plasticizer and a photoinitiator are mixed to prepare a composition, the method includes a step of crosslinking a matrix using a catalyst at room temperature or higher; and a step of polymerizing the photoreactive monomer by irradiating laser light after matrix crosslinking, and recording optical information.

In the case of producing the composition, a conventionally known mixer, stirrer, mixer or the like can be used for mixing each component without particular limitation. And, such mixing step can be performed at a temperature in the range of 0° C. to 100° C., preferably at a temperature in the range of 10° C. to 80° C., particularly preferably at a temperature in the range of 20° C. to 60° C.

A method of irradiating a laser to the photopolymer composition (or mixture) for hologram formation is not particularly limited. For example, by irradiating at least two laser beams, optical information can be recorded through cancellation and constructive interferences.

Meanwhile, the photopolymer film produced from the photopolymer composition for hologram formation or a hologram recording medium including the same according to the one embodiment may have a diffraction efficiency of 80% or more. At this time, the thickness of the photopolymer film may be, for example, in the range of 5 to 30 μm. Specifically, the diffraction efficiency may be 80% or more or 85% or more. In this manner, the recording medium of the present invention can realize excellent diffraction efficiency even when the photopolymer film is thin, such as when the photopolymer film has a thickness in the range of 5 to 30 μm. The diffraction efficiency can be calculated as in the Experimental Example below.

In addition, the hologram recording medium may have a peak shift represented by the following Equation 3 of 3% or less.

$$\text{Peak Shift}=(1-A_1/A_0)\times 100 \quad \text{[Equation 3]}$$

In Equation 3, $A_0$ and $A_1$ are wavelengths showing the lowest transmittance for the hologram recording medium in the wavelength range of 300 to 1,200 nm, wherein the $A_1$ is measured after exposing the hologram recording medium to a temperature of 60° C. and a relative humidity of 90% for 72 hours.

The peak shift describes the degree of shift of the wavelength having the lowest transmittance before and after high temperature/high humidity conditions. That is, the peak shift value being 3% or less means that deformation (contraction or expansion) of the diffraction grating can be suppressed, such as having a peak shift of 3% or less even when exposed to harsh conditions such as high temperature/high humidity. Such a holographic recording medium can provide good color reproducibility and image clearness property even when exposed to harsh conditions.

Further, the photopolymer film or a hologram recording medium including the same may have a refractive index modulation value (Δn) of 0.010 or more, for example, a refractive index modulation value (Δn) of 0.015 or more. In a specific embodiment related to the present invention, it may have a refractive index modulation value (Δn) of 0.015 to 0.030. Wherein, the thickness of the photopolymer film may be, for example, in the range of 5 to 30 μm. Specifically, the lower limit of the refractive index modulation value may be, for example, 0.010 or more, 0.015 or more, or 0.0175 or more, and the upper limit thereof may be, for example, 0.035 or less, 0.033 or less, 0.032 or less, 0.031 or less, or 0.030 or less. In this manner, the recording medium of the present invention may realize a high refractive index modulation value even when the photopolymer film is thin, for example, when the photopolymer film has a thickness in the range of 5 to 30 μm.

In the case of a reflection type hologram, the refractive index modulation value can be calculated using the Kogelnik coupled wave theory regarding the reflectance diffraction efficiency and Equation 4 below (see H. Kogelnik, The Bell System Technical Journal, volume 48, November 1969, Number 9, page 2909-page 2947).

$$\eta = \tanh^2\left|\frac{\pi\Delta nd}{\lambda\left(\cos^2\theta - \frac{\lambda}{n\Lambda}\cos\Phi\right)^{1/2}}\right| \quad \text{[Equation 4]}$$

In Equation 4, q is the reflectance diffraction efficiency (DE), d is the thickness of the photopolymer layer, k is the recording wavelength, n is the refractive index of the photopolymer, A is the diffraction grating period, Δn means the refractive index modulation amplitude (n), that is, a refractive index modulation value.

The diffraction grating formed on the photopolymer may be calculated using a known method or the like. For example, the diffraction grating can be confirmed (measured) by SEM or TEM. Alternatively, since the diffraction grating formed on the photopolymer satisfies Bragg's Equation, the grating period can be obtained using Bragg's Equation below.

[Bragg's Equation]

$$\cos(\theta - \phi) = \frac{\lambda}{2n\Lambda}$$

wherein, θ is the angle of incidence, ϕ is the slant angle of the grid, n is the refractive index of the photopolymer, and λ means the recording wavelength. A related theory can be found in THE BELL SYSTEM TECHNICAL JPUNAL, Coupled Wave Theory for Thick Hologram Gratings by HERWIG KOGELNIK (Volume 48, November 1969).

The photopolymer film contained in the hologram recording medium can be produced by irradiating a laser wave-type laser for optical information recording to a composition in which a matrix and a photoreactive monomer are mixed as described above. At this time, interference occurs between the two irradiated laser beams, wherein in the region where a constructive interference occurs, polymerization of the photoreactive monomer occurs to form a polymer, and in the region where a destructive interference occurs, polymerization of the photoreactive monomer does not occur or is inhibited, so that the photoreactive monomer is present. And, as the unreacted photoreactive monomer diffuses toward the polymer with a low monomer concentration, refractive index modulation occurs, and a diffraction grating is generated by the refractive index modulation. Thereby, a hologram, i.e., optical information, is recorded on the photopolymer film having the diffraction grating.

According to the present invention, an optical element including the hologram recording medium can be provided.

Specific examples of the optical element include optical lenses, mirrors, deflecting mirrors, filters, diffusing screens, diffraction elements, light guides, waveguides, holographic optical elements having projection screen and/or mask functions, medium of optical memory system and light diffusion plate, optical wavelength multiplexers, reflection type, transmission type color filters, and the like.

In an illustrative embodiment, an example of an optical element including the hologram recording medium may include a hologram display device. The hologram display device includes a light source unit, an input unit, an optical system, and a display unit.

For example, the light source unit is a portion that irradiates a laser beam used for providing, recording, and reproducing three-dimensional image information of an object in the input unit and the display unit.

For example, the input unit is a portion that previously inputs three-dimensional image information of an object to be recorded on the display unit, and specifically, three-dimensional information of an object such as the intensity and phase of light for each space can be inputted into an electrically addressed liquid crystal SLM, wherein an input beam may be used.

For example, the optical system may include a mirror, a polarizer, a beam splitter, a beam shutter, a lens, and the like. The optical system can be distributed into an input beam for sending a laser beam emitted from the light source unit to the input unit, a recording beam for sending the laser beam to the display unit, a reference beam, an erasing beam, a reading beam, and the like.

For example, the display unit can receive three-dimensional image information of an object from an input unit, record it on a hologram plate comprising an optically addressed SLM, and reproduce the three-dimensional image of the object. At this time, the three-dimensional image information of the object can be recorded via interference of the input beam and the reference beam. The three-dimensional image information of the object recorded on the hologram plate can be reproduced into a three-dimensional image by the diffraction pattern generated by the reading beam. The erasing beam can be used to quickly remove the formed diffraction pattern. Meanwhile, the hologram plate can be moved between a position at which a three-dimensional image is inputted and a position at which a three-dimensional image is reproduced.

Advantageous Effects

According to the present invention, there can be provided a photopolymer composition for hologram formation, a hologram recording medium and an optical element, which are excellent in reliability and can realize high recording characteristics even when used in harsh conditions such as high temperature/high humidity.

BRIEF DESCRIPTION OF DRAWINGS

FIG. 1 schematically shows the setup of a recording device for hologram recording. Specifically, FIG. 1 schematically shows the process in which a laser having a specific wavelength (e.g., 660 nm) is irradiated from a light source 10, and the irradiated laser is irradiated to a glass 80 and a PP (photopolymer film) 90 located on one surface of the glass 80, while passing through paths associated with mirrors 20 and 21, a half wave plate (HWP) 30, a spatial filter 40, a collimation lens 50, an iris 60, a Polarized Beam Splitter (PBS) 70, a mirror 22, a half wave plate (HWP) 31 and a mirror 23.

Hereinafter, the present invention will be described in more detail by way of the following examples. However, these examples are given for illustrative purposes only and are not intended to limit the scope of the present invention thereto.

PREPARATION EXAMPLE

Preparation Example 1: Method for Preparing (meth)acrylate Polymer 212 g of butyl acrylate, 198 g of ethyl acrylate, and 40 g of methyl 2-allyloxymethyl acrylate (Nippon Shokubai Co., Ltd.) were placed in a 2 L jacketed reactor, and the mixture was diluted with 1040 g of ethyl acetate. The reaction temperature was set to about 60-70° C., and stirring was performed for about 30 minutes to 1 hour. 0.32 g of n-dodecyl mercaptan was further added, and stirring was further performed for about 30 minutes. After that, 0.36 g of AIBN as a polymerization initiator was added, and polymerization was performed at the reaction temperature for 6 hours or more and maintained until the residual acrylate content was less than 1%. Thereby, a (meth)acrylate polymer containing vinyl groups in the side chains (weight average molecular weight of about 500,000 g/mol, vinyl group equivalent of 1735 g/equivalent) was prepared.

Preparation Example 2: Method for Preparing (meth)acrylate Polymer 220 g of butyl acrylate, 185 g of ethyl acrylate, and 45 g of 2-(2-vinyloxy ethoxy)ethyl acrylate (Nippon Shokubai Co., Ltd.) were placed in a 2 L jacketed reactor, and the mixture was diluted with 1000 g of ethyl acetate. The reaction temperature was set to about 60-70° C., and stirring was performed for about 30 minutes to 1 hour. 0.52 g of n-dodecyl mercaptan was further added, and stirring was performed for about 30 minutes more. After that, 0.30 g of AIBN as a polymerization initiator was added, and polymerization was performed at the reaction temperature for 6 hours or more and maintained until the residual acrylate content was less than 1%. Thereby, a (meth)acrylate polymer containing vinyl groups in the side chains (weight average molecular weight of about 300,000 g/mol, vinyl group equivalent of 1862 g/equivalent) was prepared.

Preparation Example 3: Method for Preparing a Non-Reactive Low Refractive Index Fluorine Compound 20.51 g of 2,2'-((oxybis(1,1,2,2-tetrafluoroethan-2,1-diyl))bis(oxy))bis(2,2-difluoroethan-1-ol) was placed in a 1000 ml flask, and then dissolved in 500 g of tetrahydrofuran, and 4.40 g of sodium hydride (60% dispersion in mineral oil) was carefully added several times while stirring at 0° C. After stirring at 0° C. for 20 minutes, 12.50 ml of 2-methoxyethoxymethyl chloride was slowly dropped. When it was confirmed by 1H NMR that all of the reactants were consumed, all of the reaction solvent was removed under reduced pressure. After extraction with 300 g of dichloromethane three times, the organic layers were collected, filtered with magnesium sulfate, and then reduced under reduced pressure to completely remove dichloromethane. Thereby, 29 g of a liquid product having a purity of 95% or more was obtained in a yield of 98%. The weight average molecular weight of the prepared non-reactive low refractive index fluorine compound was 586 g/mol, and the refractive index measured with an Abbe refractometer was 1.361.

Comparative Preparation Example 1: Method for Preparing (meth) acrylate Polymer 99 g of butyl acrylate and 351 g of ethyl acrylate were placed in a 2 L jacketed reactor, and diluted with 1000 g of ethyl acetate. The reaction temperature was set to about 60-70° C., and stirring was performed for about 30 minutes to 1 hour. 0.32 g of n-dodecyl mercaptan was further added, and stirring was performed for about 30 minutes. After that, 0.18 g of AIBN as a polymerization initiator was added, and polymerization was performed at the reaction temperature for 6 hours, and was maintained until the residual acrylate content was less than 1%. Thereby, a (meth)acrylate polymer (weight average molecular weight of about 500,000 g/mol, vinyl equivalent of 0 g/equivalent) was prepared.

EXAMPLES AND COMPARATIVE EXAMPLES

Example 1

First, 0.019 g of PMHS (Poly(methylhydrosiloxane), trimethylsilyl terminated, Sigma-Aldrich) having a number average molecular weight of about 390 g/mol and 0.32 g of the (meth)acrylate polymer prepared in Preparation Example 1 were mixed. 0.2 g of the fluorine compound of Preparation Example 3, 0.002 g of a photoreactive dye HNu-640 (Spectra), and 0.003 g of a silicone-based additive (Tego Rad 2500), and methyl ethyl ketone (MEK) as a solvent were added thereto, and stirred with a paste mixer in a state cutting off the light for about 10 minutes.

After that, a Karstedt (Pt-based) catalyst was added for matrix cross-linking, and liquid-phase cross-linking was performed at room temperature for 30 minutes or more.

0.34 g of HR 6042 (Miwon Specialty Chemical Co., Ltd., bisphenol fluorene epoxy acrylate, refractive index of 1.60) which is a highly refraction photoreactive monomer to the matrix, and 0.002 g of photoinitiator HR 6042 (Spectra), which is a photoinitiator, were added to a coating solution, and the mixture was further mixed for 5 minutes or more.

The coating solution was coated onto a TAC substrate having a thickness of 80 μm to a predetermined thickness using a Meyer bar, and dried at 40° C. to 60° C. within 10 minutes. After drying, the coating thickness of the photopolymer was about 15 μm, and the refractive index (n) of the photopolymer was about 1.5.

Then, the sample was allowed to stand for 24 hours or more in a dark room under constant temperature and humidity conditions of about 25° C. and 50 RH %.

Example 2

A photopolymer composition and a photopolymer film were produced in the same manner as in Example 1, except that 0.32 g of the (meth)acrylate polymer prepared in Preparation Example 2 was used instead of the (meth) acrylate polymer prepared in Preparation Example 1. The refractive index (n) of the prepared photopolymer was about 1.5.

Comparative Example 1

A photopolymer composition and a photopolymer film were produced in the same manner as in Example 1, except that a non-crosslinked matrix was formed using only a siloxane polymer (PMHS (poly(methylhydrosiloxane), trimethylsilyl terminated, Sigma-Aldrich) (not using a (meth) acrylate polymer) at the time of forming the matrix. A photopolymer composition and a photopolymer film were produced in the same manner as in Example 1.

Comparative Example 2

A photopolymer composition and a photopolymer film were produced in the same manner as in Example 1, except that 0.32 g of the (meth)acrylate polymer prepared in Comparative Preparation Example 1 was used instead of the (meth)acrylate polymer prepared in Preparation Example 1. The refractive index (n) of the photopolymer was about 1.5.

Experimental Example

The photopolymer coating surface prepared in each of Examples and Comparative Examples was laminated so as to contact the 0.70 mm thick slide glass, and at the time of recording, the laser was fixed so as to pass through the glass surface first. 660 nm and 532 nm lasers were used for recording, and the ratio of the reference beam and the object beam was 1, and the recording equipment setup was the same as in FIG. 1, and recording was performed in a reflective slanted manner (reference light=30°, object light=40°).

The film on which the reflective diffraction grating was recorded using a laser was placed in a UV irradiator (Dymax model 2000 flood) in a state attached to the glass, and irradiated with UV with UVA intensity of 105 mW/S for about 1 minute to remove the color of the dye. A photobleaching process was performed so that the reaction of the monomers could be terminated.

1. Diffraction Efficiency (η)

As described in relation to Examples and Comparative Examples, the photopolymer coated surface prepared in each of Examples and Comparative Examples was laminated on slide glass, and fixed so that the laser first pass through the glass surface at the time of recording. Lasers of 660 nm and 532 nm were used for recording, and the ratio between reference beam and object beam was 1. The setup of the recording device was as the same as shown in FIG. 1, and recording was performed in a reflective slanted manner (reference light=30°, object light=40°).

A holographic recording was performed via the interference of two interference lights (reference light and object light), and the transmission-type recording was performed so that the two beams (reference light and object light) were incident on opposite surfaces of the sample. The diffraction efficiencies were changed according to the incident angle of the two beams, and become non-slanted when the incident angles of the two beams are the same. In the non-slanted recording, the diffraction grating was generated vertically to the film because the incident angles of the two beams were the same on the normal basis. Recording was performed using a laser with a wavelength such as 532 nm and 660 nm in a reflective slanted manner (reference light=30°, object light=40°), and the diffraction efficiency (q) was calculated using Equation 1 below.

$$\eta = P_D/(P_D+P_T) \quad \text{[Equation 1]}$$

In Equation 1, η is the diffraction efficiency, $P_D$ is the output amount of the diffracted beam of the sample after recording (mW/cm$^2$), $P_T$ is the output amount (mW/cm$^2$) of the transmitted beam of the sample after recording. The diffraction efficiency value calculated by Equation 1 was calculated as a percentage (%).

2. Laser Loss ($I_{loss}$)

The laser loss ($I_{loss}$) was calculated from Equation 2 below.

$$I_{loss} = 1-\{(P_D+P_T)/I_O\} \quad \text{[Equation 2]}$$

In Equation 2, $P_D$ is the output amount of the diffracted beam of the sample after recording (mW/cm$^2$), $P_T$ is the output amount of the transmitted beam of the recorded sample (mW/cm$^2$), and $I_0$ is the intensity of the recording light.

3. Peak Shift

First, a specific wavelength (or wavelength band) $A_0$ having a maximum reflectance (i.e., a lowest transmission rate) seen by the sample recording the diffraction grating was analyzed in the same manner as in Examples and Comparative Examples (analyzed at room temperature and non-high humidity conditions). UV-Vis spectroscopy was used for the analysis, and the analysis wavelength range was 300 to 1,200 nm.

After that, the same sample was stored under high temperature/high humidity conditions with a temperature of 60° C. and a humidity of 90 RH % for 72 hours, and the wavelength (or wavelength band) ($A_1$) having the maximum reflectance (lowest transmittance) was recorded by the same method. The peak shift, which is the degree of shift of the wavelength having the lowest transmittance before and after evaluation, was measured according to Equation 3 below. At this time, it was assumed that deformation of the film (e.g., contraction or expansion) did not affect the surface pitch, but occurred only in the direction perpendicular to the plane of the film.

$$\text{Peak Shift} = (1-A_1/A_0)\times 100 \quad \text{[Equation 3]}$$

The degree of peak shift being low means that the deformation (contraction or expansion) of the diffraction grating can be suppressed, such as having a peak shift of grade A even when exposed to harsh conditions such as high temperature/high humidity, and as a result, the holographic recording medium can provide good color reproducibility and image clearness property even when exposed to harsh conditions.

4. Refractive Index Modulation Value

It was calculated using Equation 4 and Bragg's equation below.

$$\eta = \tanh^2\left|\frac{\pi\Delta n d}{\lambda\left(\cos^2\theta - \frac{\lambda}{n\Lambda}\cos\Phi\right)^{1/2}}\right| \quad \text{[Equation 4]}$$

In Equation 4, η is the reflectance diffraction efficiency (DE), d is the thickness of the photopolymer layer, λ is the recording wavelength, n is the refractive index of the photopolymer, Λ is the diffraction grating period, Δn means a refractive index modulation value.

[Bragg's Equation]

$$\cos(\theta-\phi) = \frac{\lambda}{2n\Lambda}$$

wherein, θ is the angle of incidence, ϕ is the slant angle of the grid, n is the refractive index of the photopolymer, and k means the recording wavelength.

TABLE 1

| | Example 1 | Example 2 | Comparative Example 1 | Comparative Example 2 |
|---|---|---|---|---|
| Laser efficiency (DE, %) | 85 | 85 | 5 | 80 |
| Lase loss (Iloss)(%) | 10 | 10 | 11 | 12 |
| Peak shift(%) | 1 | 1 | 40 | 30 |
| Refractive index modulation value (Δn) | 0.018 | 0.018 | 0.003 | 0.017 |

As shown in Table 1, it was confirmed that in the case of the photopolymer compositions of Examples, the diffraction efficiency is excellent, the peak shift and laser loss are low, and thus good color reproducibility and image clearness property can be achieved even when exposed to harsh conditions, and further, high refractive index modulation value can be realized.

Meanwhile, it was confirmed that in the case of the photopolymer compositions of Comparative Examples, not only the diffraction efficiency is poor and the laser loss is large, but also the peak shift value is large.

The invention claimed is:

1. A photopolymer composition for hologram formation, comprising:

a polymer matrix comprising a siloxane-based polymer and a (meth)acrylate polymer containing one or more reactive functional groups in the side chains;

a photoreactive monomer; and a photoinitiator, wherein the one or more reactive functional groups comprise a functional group represented by the following Chemical Formula 2:

[Chemical Formula 2]

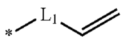

wherein, in the Chemical Formula 2, $L_1$ is an oxyalkylene group having 1 to 10 carbon atoms, an oxyalkenylene group having 2 to 20 carbon atoms, or an oxyalkynylene group having 2 to 20 carbon atoms.

2. The photopolymer composition for hologram formation according to claim 1, wherein:

the polymer matrix comprises a cross-linked copolymer between the siloxane-based polymer and the (meth) acrylate polymer containing one or more reactive functional groups in the side chains.

3. The photopolymer composition for hologram formation according to claim 2, wherein:

the siloxane-based polymer and the (meth)acrylate polymer containing one or more reactive functional groups in the side chains are cross-linked in the presence of a platinum catalyst.

4. The photopolymer composition for hologram formation according to claim 1, wherein:

the siloxane-based polymer and the (meth)acrylate polymer containing one or more reactive functional groups in the side chains are cross-linked in the presence of a platinum catalyst.

5. The photopolymer composition for hologram formation according to claim 1, wherein:

the one or more reactive functional groups comprise a functional group represented by the following Chemical Formula 2-1:

[Chemical Formula 2-1]

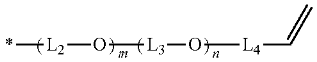

wherein, in the Chemical Formula 2-1, $L_2$ to $L_3$ are each independently one of an alkylene group having 1 to 10 carbon atoms, an alkenylene group having 2 to 10 carbon atoms, and an alkynylene group having 2 to 10 carbon atoms, $L_4$ is one of a direct bond, an alkylene group having 1 to 10 carbon atoms, an alkenylene group having 2 to 10 carbon atoms, and an alkynylene group having 2 to 10 carbon atoms, m is an integer from 1 to 10, and n is an integer from 0 to 10.

6. The photopolymer composition for hologram formation according to claim 1, wherein:

the (meth)acrylate polymer containing one or more reactive functional groups in the side chains comprises a repeating unit represented by the following Chemical Formula 3 or a repeating unit represented by the following Chemical Formula 4:

[Chemical Formula 3]

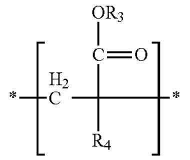

wherein, in the Chemical Formula 3, $R_3$ is hydrogen or an alkyl group having 1 to 10 carbon atoms, and $R_4$ is a reactive functional group containing one or more vinyl groups,

[Chemical Formula 4]

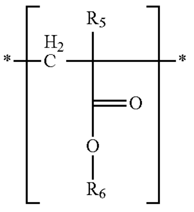

wherein, in the Chemical Formula 4, $R_5$ is hydrogen or an alkyl group having 1 to 10 carbon atoms, and $R_6$ is a reactive functional group containing one or more vinyl groups.

7. The photopolymer composition for hologram formation according to claim 1, wherein:

the siloxane-based polymer has a number average molecular weight of 200 g/mol or more and 800 g/mol or less.

8. The photopolymer composition for hologram formation according to claim 1, wherein:

the (meth)acrylate polymer containing one or more reactive functional groups in the side chains has a weight average molecular weight of 200,000 g/mol or more and 900,000 g/mol or less.

9. The photopolymer composition for hologram formation according to claim 1, wherein:

the (meth)acrylate polymer containing one or more reactive functional groups in the side chains has a reactive functional group equivalent of 500 g/equivalent or more and 3000 g/equivalent or less.

10. The photopolymer composition for hologram formation according to claim 1, further comprising a plasticizer containing at least one compound selected from the group consisting of a phosphorus-based compound and a fluorine-based compound.

11. The photopolymer composition for hologram formation according to claim 10, wherein:

the fluorine-based compound comprises a low refractive index fluorine compound containing at least one functional group selected from the group consisting of an ether group, an ester group, and an amide group, and two or more difluoromethylene groups; and has a refractive index of less than 1.45.

12. The photopolymer composition for hologram formation according to claim 1, wherein:

the photoreactive monomer has a refractive index of at least 1.50.

13. A hologram recording medium produced from the photopolymer composition for hologram formation according to claim 1.

14. An optical element comprising the hologram recording medium according to claim 13.

* * * * *